US012672429B2

(12) United States Patent
Kodama

(10) Patent No.: US 12,672,429 B2
(45) Date of Patent: Jun. 30, 2026

(54) ELECTRO-OPTICAL DEVICE AND ELECTRONIC DEVICE WITH CONDUCTIVE LAYER ELECTRICALLY COUPLED TO SYMMETRICALLY ARRANGED DRIVE TRANSISTORS

(71) Applicant: SEIKO EPSON CORPORATION, Tokyo (JP)

(72) Inventor: Takumi Kodama, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 865 days.

(21) Appl. No.: 17/855,725

(22) Filed: Jun. 30, 2022

(65) Prior Publication Data

US 2023/0006017 A1 Jan. 5, 2023

(30) Foreign Application Priority Data

Jul. 2, 2021 (JP) ................................. 2021-110662

(51) Int. Cl.
*H10K 59/121* (2023.01)
*H10K 59/131* (2023.01)

(52) U.S. Cl.
CPC ....... *H10K 59/1213* (2023.02); *H10K 59/131* (2023.02)

(58) Field of Classification Search
CPC ......................... H10K 59/1213; H10K 59/131
See application file for complete search history.

(56) References Cited

U.S. PATENT DOCUMENTS

| | | | | |
|---|---|---|---|---|
| 6,587,086 | B1* | 7/2003 | Koyama | ............ H10D 30/6745 |
| | | | | 345/84 |
| 6,771,028 | B1* | 8/2004 | Winters | ............... H10K 59/131 |
| | | | | 315/169.3 |
| 7,710,022 | B2* | 5/2010 | Cok | ..................... H10K 59/121 |
| | | | | 313/503 |
| 8,653,541 | B2 | 2/2014 | Ikeda et al. | |
| 2004/0108978 | A1* | 6/2004 | Matsueda | ............ H10K 59/131 |
| | | | | 345/76 |
| 2009/0109148 | A1* | 4/2009 | Tokuda | .............. H10K 59/1216 |
| | | | | 345/76 |
| 2010/0270678 | A1 | 10/2010 | Ikeda et al. | |
| 2014/0139106 | A1 | 5/2014 | Minami et al. | |
| 2015/0009105 | A1* | 1/2015 | Nomura | ............... G09G 3/3266 |
| | | | | 345/76 |
| 2018/0097016 | A1 | 4/2018 | Yang et al. | |

FOREIGN PATENT DOCUMENTS

| | | |
|---|---|---|
| JP | 2010272845 | 12/2010 |
| JP | 2014102319 | 6/2014 |
| JP | 2015011297 | 1/2015 |
| JP | 2019056911 | 4/2019 |

* cited by examiner

*Primary Examiner* — Lex H Malsawma
(74) *Attorney, Agent, or Firm* — JCIPRNET

(57) ABSTRACT

An electro-optical device includes one supply circuit corresponding to one light-emitting element and another supply circuit corresponding to another light-emitting element and provided in a first direction relative to the one supply circuit in plan view, in which each of the supply circuits includes a transistor configured to drive a corresponding light-emitting element. In addition, the electro-optical device includes a conductive layer electrically coupled to the two transistors and supplied with a potential that is a constant potential, and the conductive layer is provided along a second direction intersecting the first direction.

12 Claims, 15 Drawing Sheets

FIRST
DIRECTION

SECOND
DIRECTION

ELECTRO-OPTICAL DEVICE AND ELECTRONIC DEVICE WITH CONDUCTIVE LAYER ELECTRICALLY COUPLED TO SYMMETRICALLY ARRANGED DRIVE TRANSISTORS

The present application is based on, and claims priority from JP Application Serial Number 2021-110662, filed on Jul. 2, 2021, the disclosure of which is hereby incorporated by reference herein in its entirety.

BACKGROUND

1. Technical Field

The present disclosure relates to an electro-optical device and an electronic device.

2. Related Art

As described in JP-A-2014-102319, there is a known display device that includes pixels arrayed in a matrix manner. The pixels each include a light emitting portion and a driving circuit configured to drive the light emitting portion. In this display device, an m-th pixel in the column direction and an (m+1)-th pixel are provided so as to be symmetric with respect to a boundary line extending in the row direction between the m-th pixel and the (m+1)-th pixel, and a shield wall is formed on the boundary line.

However, in a case of the display device described in JP-A-2014-102319, a control line, a power-supply wiring and other line wiring lines electrically coupled to the driving circuit are provided for each column or each row. This leads to a problem in that it is not possible to provide a display device having higher definition.

SUMMARY

An electro-optical device includes a first light-emitting element, a second light-emitting element, a first drive transistor corresponding to the first light-emitting element, a second drive transistor corresponding to the second light-emitting element and provided in a first direction relative to the first drive transistor in plan view, and a first conductive layer electrically coupled to the first drive transistor and the second drive transistor and supplied with a constant potential, the first conductive layer being provided along a second direction intersecting the first direction.

An electronic device includes the electro-optical device described above.

DESCRIPTION OF EXEMPLARY EMBODIMENTS

Below, embodiments according to the present disclosure will be described with reference to the drawings. The embodiments described below will be described as one example of the present disclosure. The present disclosure is not limited to the following embodiments.

It should be noted that, in each of the drawings below, the scale of each layer or member is set so as to differ from the actual scale thereof in order to make each layer or member have a recognizable size. In the following description, for example, when the statement "on the substrate" is used for a substrate, this represents any one of a case where something is disposed on the substrate in a contacted manner, a case where something is disposed at the substrate with another structure being interposed therebetween, and a case where a portion of something is disposed on the substrate in a contacted manner and a portion of it is disposed with another structure being interposed therebetween.

1A. First Embodiment

An organic EL (electroluminescence) device will be given as an electro-optical device according to a first embodiment by way of example. This organic EL device is used favorably, for example, in a head mounted display (HMD) or the like serving as an electronic device that will be described later. The outline of an electro-optical device 1 according to the present embodiment will be described with reference to FIGS. 1 and 2.

Figure 1:
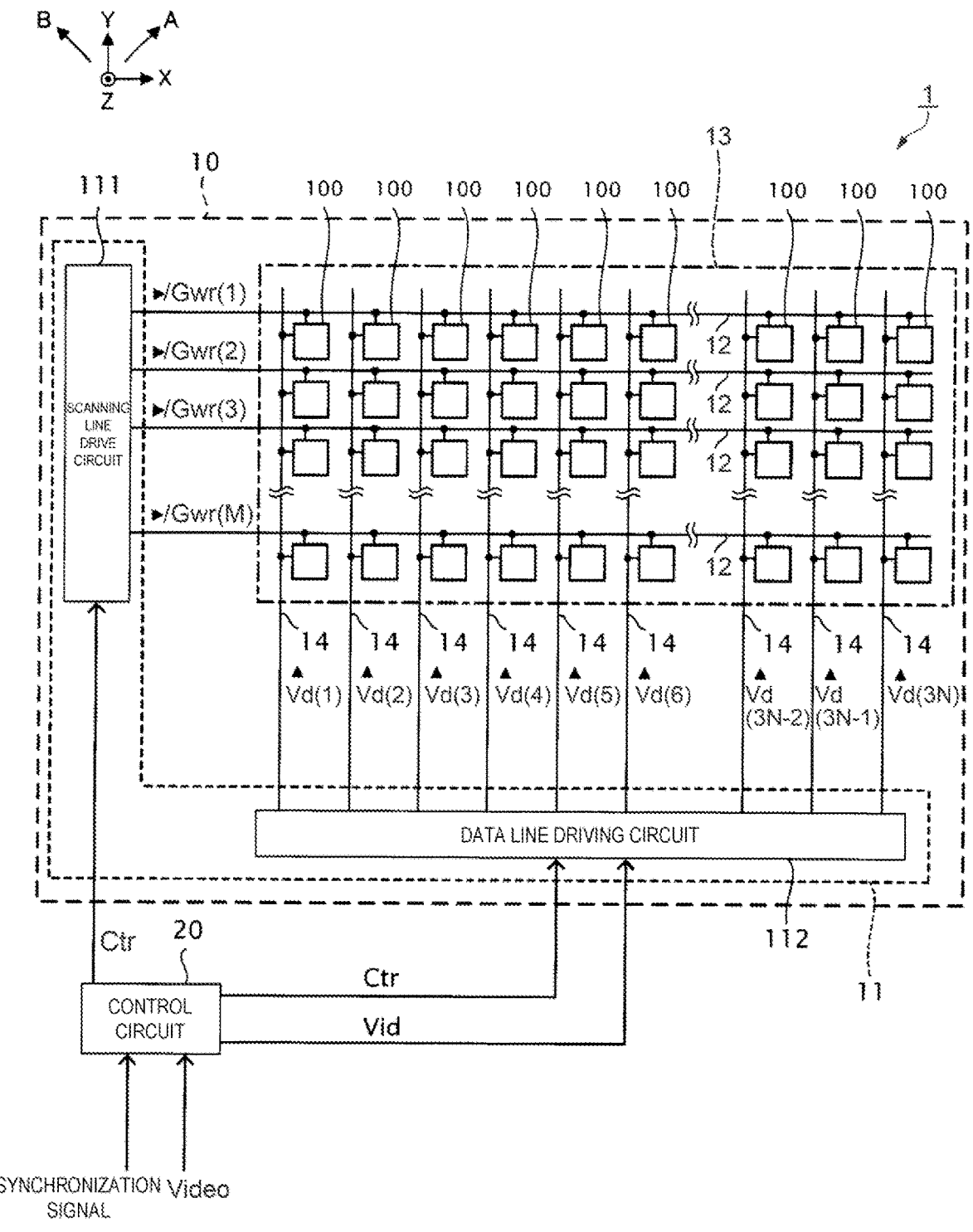
FIG. 1 is a block diagram illustrating the configuration of an electro-optical device according to a first embodiment.

As illustrated in FIG. 1, the electro-optical device 1 according to the present embodiment includes a display panel 10 including a plurality of pixel circuits 100 that will be described later, and a control circuit 20 configured to control operation of the display panel 10.

The control circuit 20 is supplied, from an upper-layer device that is not illustrated, with a digital image data Video in synchronization with a synchronization signal. Here, the image data Video is digital data used to define a gray scale level that each of the pixel circuits 100 of the display panel 10 is supposed to display. In addition, the synchronization signal is a signal including a vertical synchronization signal, a horizontal synchronization signal, a dot clock signal, and the like.

The control circuit 20 is configured to generate a control signal Ctr used to control operation of the display pane 10, and supplies the generated control signal Ctr to the display panel 10. In addition, the control circuit 20 generates an analog image signal Vid on the basis of the image data Video, and supplies the generated image signal Vid to the display panel 10. Here, the image signal Vid is a signal used to define the luminance of a light-emitting element included in each of the pixel circuits 100 such that each of the pixel circuits 100 displays a gray-scale designated in the image data Video.

The display panel 10 includes: M pieces of scanning lines 12 extending along the X-axis; 3N pieces of data lines 14 extending along the Y-axis intersecting the X-axis; a display unit 13 including "M×3N" pieces of pixel circuits 100 arrayed so as to correspond to intersections of the M pieces of scanning lines 12 and the 3N pieces of data lines 14; and a driving circuit 11 configured to drive the display unit 13. Here, the "M" and the "N" are natural numbers equal to or more than 1 and are each independent of each other.

In the following description, in order to distinguish the plurality of pixel circuits 100, the plurality of scanning lines 12, and the plurality of data lines 14 from each other, the rows are referred to as the first row, the second row, . . . , and the M-th row in order toward the –Y direction, and the columns are referred to as the first column, the second column, . . . , and the 3N-th column in order toward the +X direction.

The plurality of pixel circuit 100 provided in the display unit 13 includes a pixel circuit 100 that can display red color (R), a pixel circuit 100 that can display green color (G), and a pixel circuit 100 that can display blue color (B). In addition, in the electro-optical device 1, it is assumed that a pixel circuit 100 that can display the R is disposed at the (3n−2)-th column from the first column to the 3N-th column, a pixel circuit 100 that can display the G is disposed at the (3n−1)-th column, and a pixel circuit 100 that can display the B is disposed at the 3n-th column, where "n" is a natural number that satisfies $1 \leq n \leq N$, in the electro-optical device 1, by way of example. The driving circuit 11 includes a scanning line drive circuit 111 and a data line driving circuit 112.

The scanning line drive circuit 111 sequentially selects scanning lines 12 from the first to the M-th rows. Specifically, in a period of one frame, the scanning line drive circuit 111 sequentially sets a predetermined selection potential for each horizontal scanning period as scanning signals /Gwr(1) to /Gwr(M) outputted to individual scanning lines 12 from the first to the M-th rows, thereby sequentially selecting the scanning lines 12 for each horizontal scanning period one row by one row. In other words, in the m-th horizontal scanning period in a period of one frame, the scanning line drive circuit 111 sets a predetermined selection potential as the scanning signal /Gwr(m) outputted to the scanning line 12 at the m-th row, thereby selecting the scanning line 12 at the m-th row. Note that the period of one frame is a period in which the electro-optical device 1 displays one image.

For each horizontal scanning period, the data line driving circuit 112 outputs, to 3N pieces of data lines 14, analog data signals Vd(1) to Vd(3N) used to define the gray-scale that each of the pixel circuits 100 is supposed to display, on the basis of the image signal Vid and the control signal Ctr each supplied from the control circuit 20. In other words, for each horizontal scanning period, the data line driving circuit 112 outputs a data signal Vd(k) to the data line 14 at the k-th column.

Note that, in the present embodiment, the image signal Vid outputted by the control circuit 20 is an analog signal. However, the image signal Vid outputted by the control circuit 20 may be a digital signal. In this case, the data line driving circuit 112 performs D-A conversion to the image signal Vid to generate analog data signals Vd(1) to Vd(3N).

Figure 2:
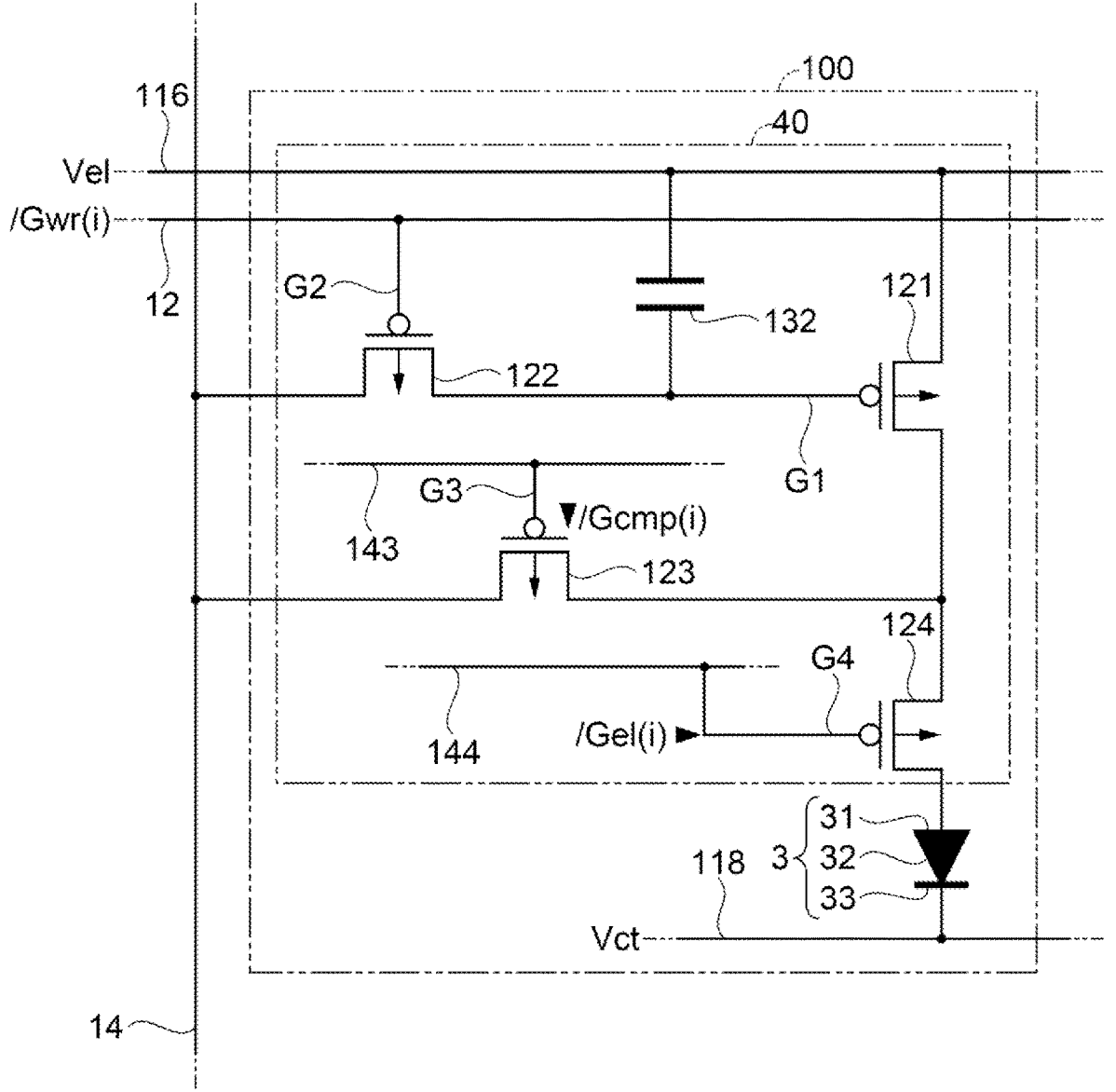
FIG. 2 is an equivalent circuit diagram illustrating an electrical configuration of a pixel circuit in the electro-optical device.

As illustrated in FIG. 2, the pixel circuit 100 includes a light-emitting element 3, and a supply circuit 40 configured to supply a current to the light-emitting element 3. The light-emitting element 3 includes a pixel electrode 31, a light emission function layer 32, and a counter electrode 33. The pixel electrode 31 functions an anode that supplies the light emission function layer 32 with a positive hole. The counter electrode 33 is electrically coupled to the power-supply wiring line 118 that is set to have a potential Vct that is a power supply potential at the low potential side of the pixel circuit 100, and functions as a cathode that supplies electrons to the light emission function layer 32. In addition, the positive hole supplied from the pixel electrode 31 and the electron supplied from the counter electrode 33 are re-combined at the light emission function layer 32 to cause the light emission function layer 32 to emit light.

Note that, although detailed description will not be made, a red color filter is disposed so as to overlap with the light-emitting element 3 included in the pixel circuit 100 that can emit the R light. A green color filter is disposed so as to overlap with the light-emitting element 3 included in the pixel circuit 100 that can emit the G light. A blue color filter is disposed so as to overlap with the light-emitting element 3 included in the pixel circuit 100 that can emit the B light.

The supply circuit 40 includes a P-channel type transistors 121 to 124, and a capacitance element 132. Furthermore, a supply circuit 40 at the i-th row is supplied with a scanning signal /Gwr(i) as well as control signals /Gcmp(i) and /Gel(i) from the scanning line drive circuit 111. The display panel 10 includes M rows of control lines 143 and M rows of control lines 144. The scanning line drive circuit 111 supplies control lines 143 at the first, second, third, . . . , M-th rows with control signals /Gcmp(1), /Gcmp(2), /Gcmp (3), . . . , and /Gcmp(M), respectively, and supplies control lines 144 at the first, second, third, . . . , M-th rows with control signals /Gel(1), /Gel(2), /Gel(3), . . . , and /Gel(M), respectively.

A gate electrode G1 of the transistor 121 is electrically coupled to one of the source/drain regions of the transistor 122. In addition, the one of the source/drain regions of the transistor 121 is electrically coupled to the power-supply wiring line 116 serving as a second conductive layer to which a potential Vel that is a constant potential is supplied. The other of the source/drain regions of the transistor 121 is electrically coupled to one of the source/drain regions of the transistor 123 and one of the source/drain regions of the transistor 124. Note that one end of the capacitance element 132 is electrically coupled to the gate electrode G1 of the transistor 121. The other end of the capacitance element 132 is electrically coupled to the power-supply wiring line 116 having a constant potential such as a potential Vel. With this configuration, the capacitance element 132 holds a voltage across the gate electrode G1 and one of the source/drain regions at the transistor 121. This transistor 121 serves as one example of a drive transistor configured to cause a flow of electric current corresponding to a voltage across the gate electrode G1 and one of the source/drain regions of the transistor 121.

Note that, as for the capacitance element 132, it may be possible, for example, to use a capacitor that parasitizes the gate electrode G1 of the transistor 121, or use a capacitor formed, at a silicon substrate, by interposing an insulating layer between conductive layers differing from each other.

The transistor 122 of the supply circuit 40 at the i-th row and any given column is configured such that: the gate electrode G2 is electrically coupled to the scanning line 12 at the i-th row; one of the source/drain regions is electrically coupled to the gate electrode G1 of the transistor 121; and the other of the source/drain regions is coupled to the data line 14 at this column.

The transistor 123 of the supply circuit 40 at the i-th row and any given column is configured such that: the gate electrode G3 is electrically coupled to the control line 143 supplied with the control signal/Gcmp(i); one of the source/drain regions is electrically coupled to the other of the source/drain regions of the transistor 121 as well as one of the source/drain regions of the transistor 124; and the other of the source/drain regions is electrically coupled to the data line 14 at this column.

The transistor 124 of the supply circuit 40 at the i-th row and any given column is configured such that: the gate electrode G4 is electrically coupled to the control line 144 supplied with the control signal /Gel(i); one of the source/drain regions is electrically coupled to the other of the source/drain regions of the transistor 121 as well as one of the source/drain regions of the transistor 123; and the other of the source/drain regions is electrically coupled to the pixel electrode 31 serving as an anode of the light-emitting element 3.

Note that the counter electrode 33 functioning as a cathode of the light-emitting element 3 is electrically coupled to the power-supply wiring line 118 having a potential Vct. In addition, the display panel 10 is formed at a silicon substrate, and hence, the substrate potential of the transistors 121 to 124 is a potential corresponding, for example, to the potential Vel.

Note that the source area and the drain region of the transistors 121 to 124 described above may be interchanged depending on the channel type or the relationship of potential of the transistors 121 to 124. In addition, the transistors 121 to 124 may be a thin membrane transistor or may be a field effect transistor.

Next, the structure of the pixel circuit 100, in particular, the structure of the supply circuit 40 will be described with reference to FIGS. 3 to 8. Note that, as for the substrate, the present embodiment uses a P-type semiconductor substrate that is a silicon substrate. An N-well 170 is formed at almost the entire area of the substrate.

The N-well 170 is supplied with the potential Vel through an N-type diffusion region. In addition, impurities are doped at the front surface of the N-well 170 to form a plurality of P-type diffusion regions. The P-type diffusion regions can function as one or the other of the source/drain regions of the transistors 121 to 124. In the present embodiment, the P-type diffusion region and the N-type diffusion region are collectively referred to as an impurity region 180.

Figure 3:
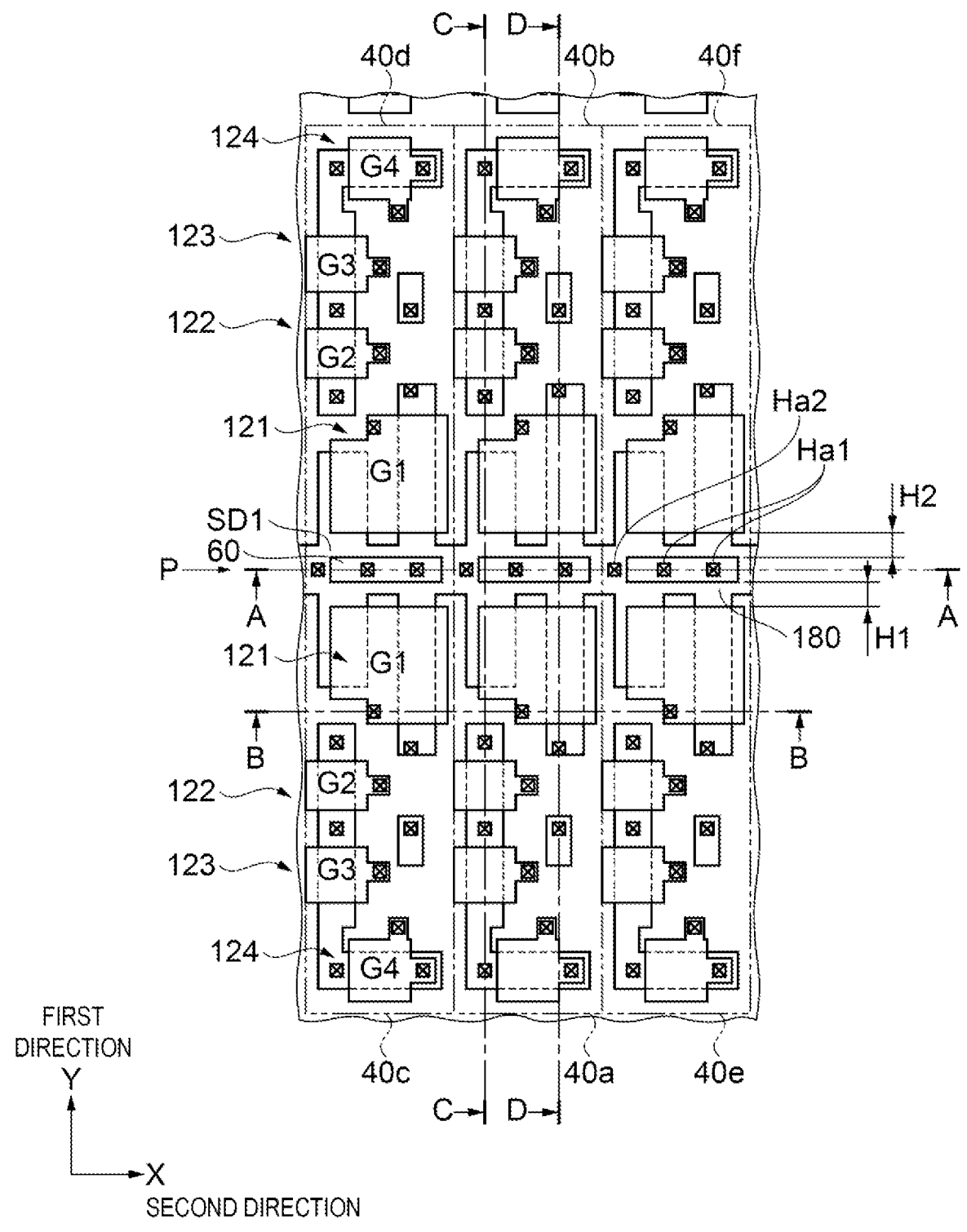
FIG. 3 is a plan view illustrating the layout of a gate electrode and an impurity region at a supply circuit.

FIG. 3 is a plan view illustrating the layout of the impurity region 180 and the gate electrodes G1 to G4 at supply circuits 40a to 40f in which three are disposed adjacent to each other in a direction of the X-axis and two are disposed adjacent to each other in a direction of the Y-axis. The gate electrodes G1 to G4 are formed, through a gate insulating film L0, on the region that is a portion of the silicon semiconductor substrate. In the semiconductor substrate at both sides of the electrodes, the impurity region 180 that is to be source/drain regions is formed, and then, the transistors 121 to 124 are formed.

Figure 4:
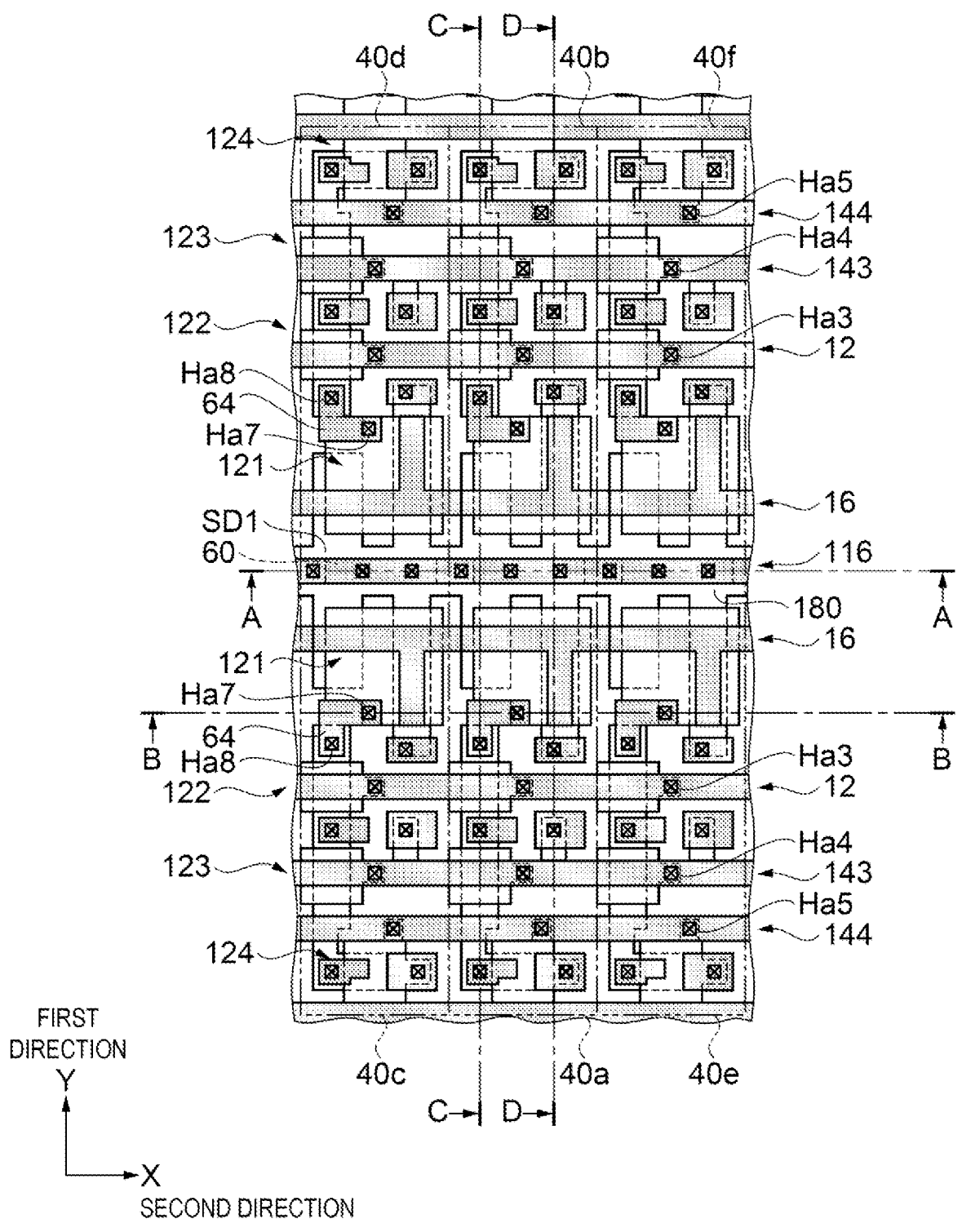
FIG. 4 is a plan view illustrating the layout of a first wiring layer at the supply circuit.

FIG. 4 is a plan view illustrating the layout of a first wiring layer M1 (see FIG. 5) at the supply circuits 40a to 40f illustrated in FIG. 3. In FIG. 4, the layout of the first wiring layer M1 is illustrated on the layout of the gate electrodes G1 to G4 and the impurity region 180. The first wiring layer M1 is formed, through an interlayer insulating layer L1, on the semiconductor substrate on which the transistors 121 to 124 are formed. For example, the interlayer insulating layer L1 is made of silicon dioxide, and the first wiring layer M1 is made of aluminum. In addition, the marks "x" each provided within the square in the drawing indicates a contact hole provided in the interlayer insulating layer L1 to couple wiring lines at each layer to the upper layer.

Figure 5:
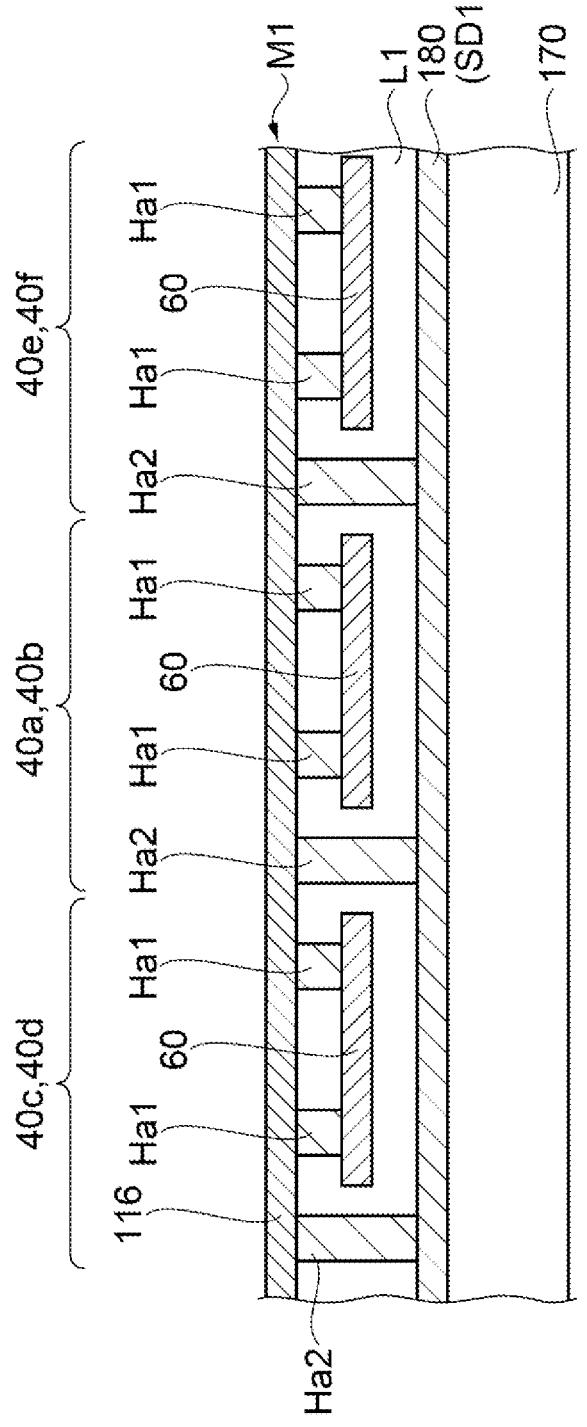
FIG. 5 is a cross-sectional view taken along the line A-A illustrated in FIG. 4.
Figure 6:
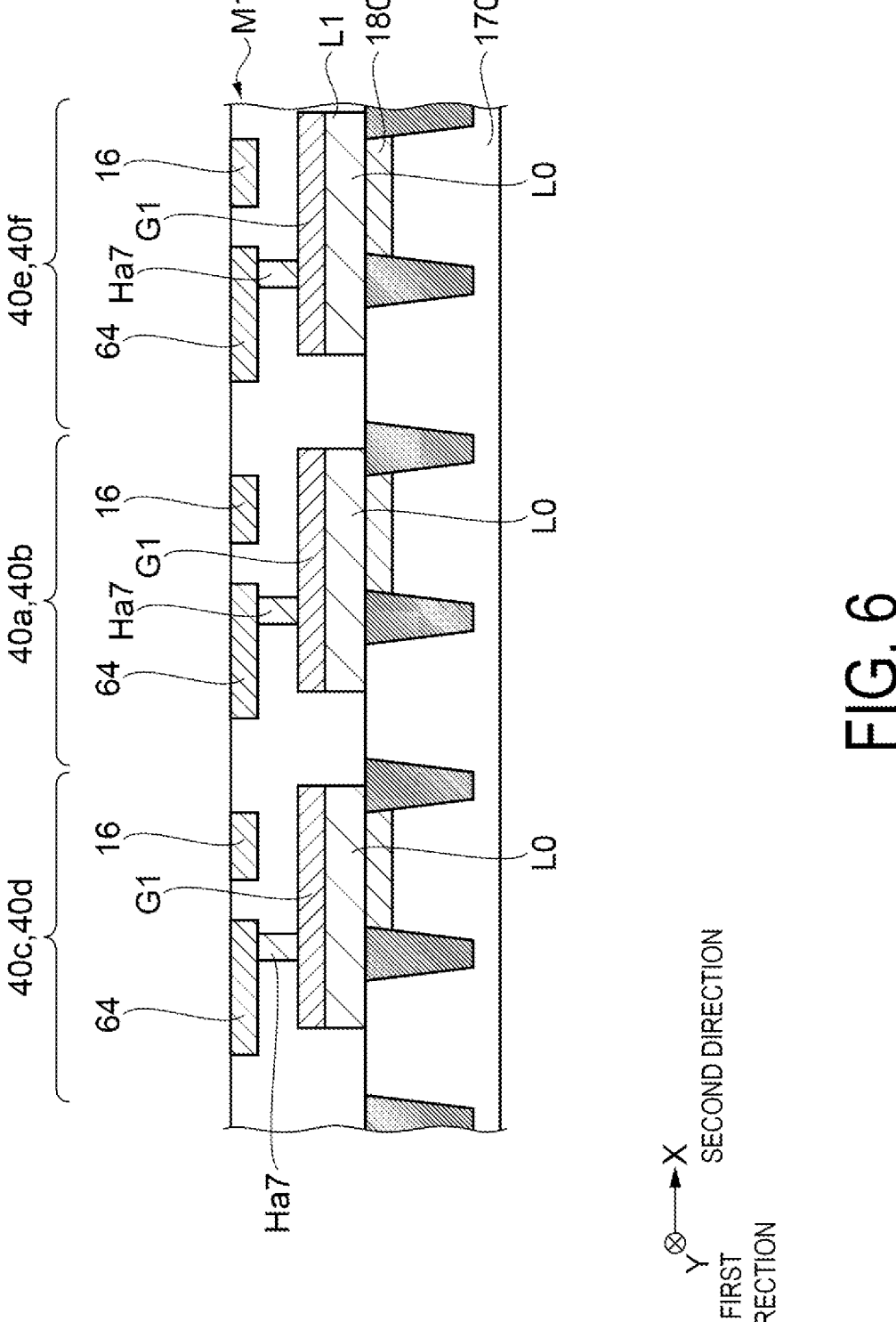
FIG. 6 is a cross-sectional view taken along the line B-B illustrated in FIG. 4.
Figure 7:
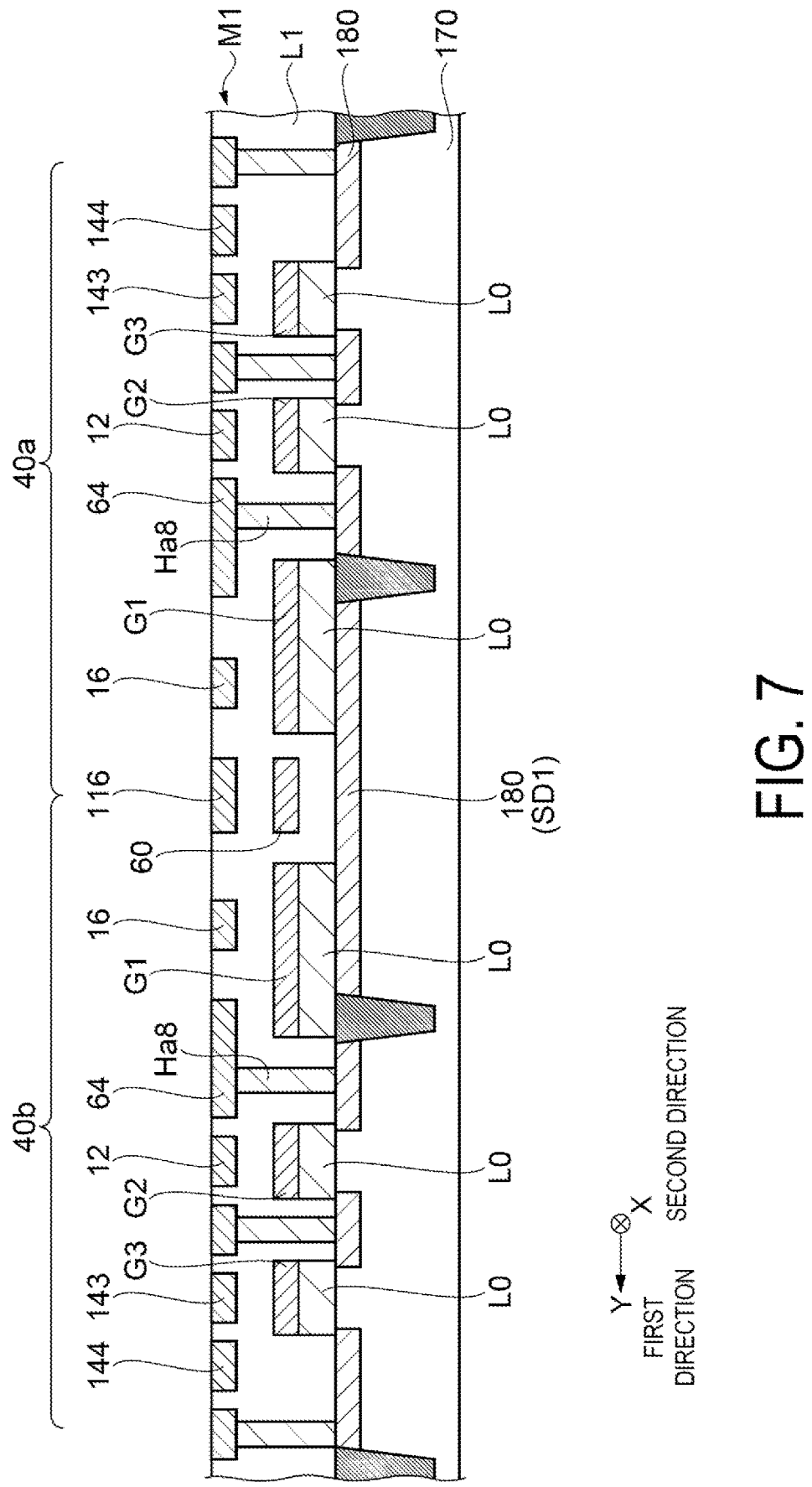
FIG. 7 is a cross-sectional view taken along the line C-C illustrated in FIG. 4.
Figure 8:
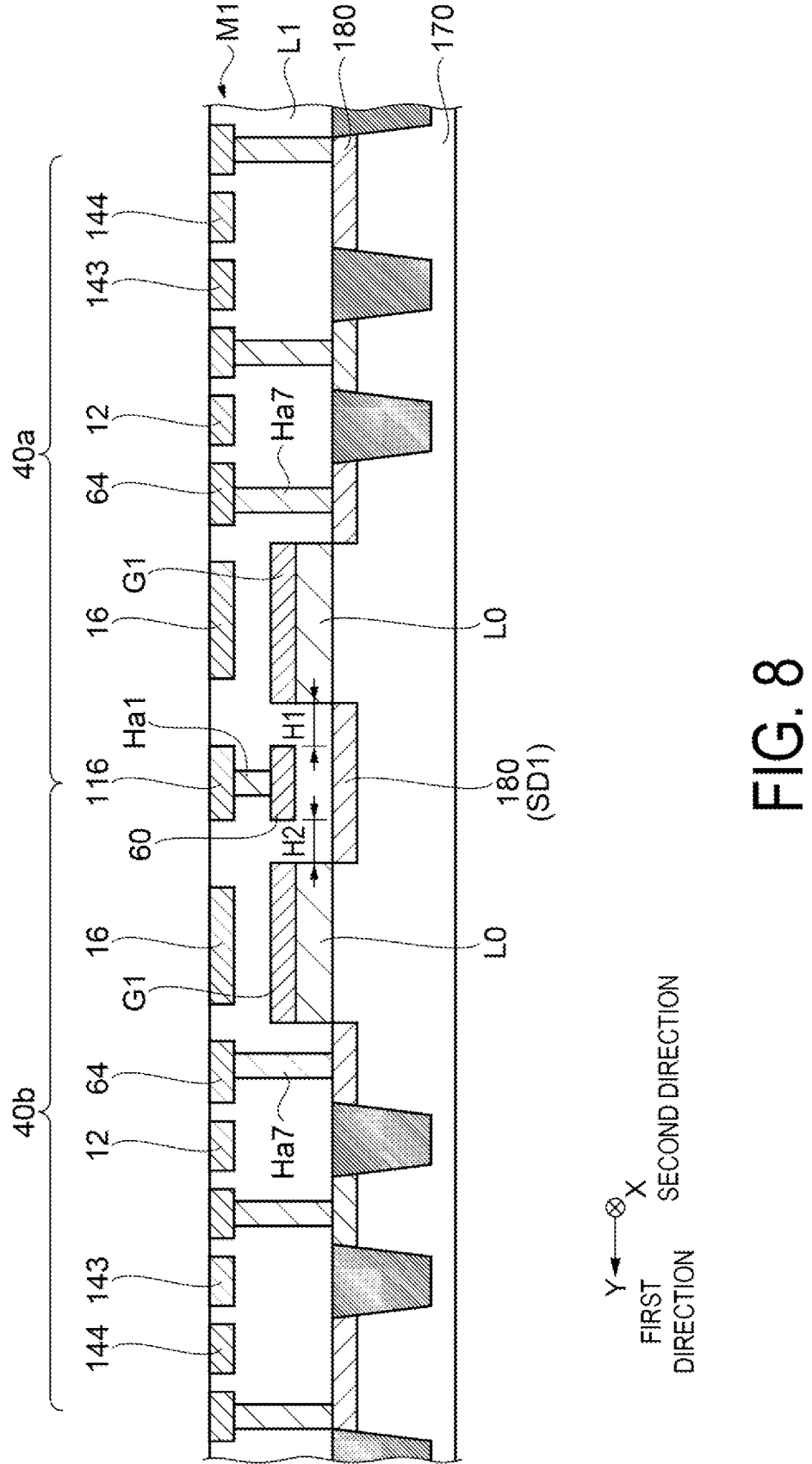
FIG. 8 is a cross-sectional view taken along the line D-D illustrated in FIG. 4.

FIG. 5 is a cross-sectional view taken along the line A-A in FIG. 4. FIG. 6 is a cross-sectional view taken along the line B-B in FIG. 4. FIG. 7 is a cross-sectional view taken along the line C-C in FIG. 4. FIG. 8 is a cross-sectional view taken along the line D-D in FIG. 4. FIGS. 5 to 8 only illustrate a portion up to the first wiring layer M1 and do not illustrate the structural body at the upper layer. In addition, the configurations of the six supply circuits 40a to 40f are substantially the same between the rows, and hence, the reference characters are not attached to constituent elements as appropriate. Note that, hereinafter, of the supply circuits 40a to 40f, description will be made mainly of the supply circuits 40a and 40b. However, the supply circuits 40c and 40d and the supply circuits 40e and 40f have a similar configuration.

As illustrated in FIGS. 3 to 8, the supply circuits 40a to 40f each include the transistors 121 to 124. Furthermore, a conductive layer 60 serving as a first conductive layer disposed along the direction of the X-axis is provided between the supply circuit 40a and the supply circuit 40b disposed adjacent to each other in the direction of the Y-axis in plan view. In other words, the conductive layer 60 extends across both the supply circuit 40a and the supply circuit 40b. The conductive layer 60 is a conductive layer supplied with the potential Vel that is a constant potential, and is electrically couple to the transistor 121 included in the supply circuit 40a and the transistor 121 included in the supply circuit 40b. The conductive layer 60 is provided at the same layer as the gate electrodes G1 to G4 of the transistors 121 to 124. Note that, hereinafter, the direction the Y-axis is also referred to as a "first direction", and the direction of the X-axis intersecting the direction of the Y-axis is also referred to as a "second direction".

Specifically, the conductive layer 60 is electrically coupled, through a contact hole Ha1, to the power-supply wiring line 116 provided at the first wiring layer M1. In other words, the conductive layer 60 and the power-supply wiring line 116 are supplied with the same potential. Furthermore, the power-supply wiring line 116 is electrically coupled, through a contact hole Ha2, to a region SD1 of the impurity region 180 that is to be one of the source/drain regions of the transistor 121. In other words, the conductive layer 60 is electrically coupled, through the power-supply wiring line 116, to the region SD1 that is to be one of the source/drain regions of the transistor 121.

Furthermore, in plan view, the conductive layer 60 is provided between the gate electrode G1 of the transistor 121 included in the supply circuit 40a and the gate electrode G1 of the transistor 121 included in the supply circuit 40b.

In addition, in plan view, the distance H1 between the conductive layer 60 and the gate electrode G1 of the transistor 121 included in the supply circuit 40a is equal to the distance H2 between the conductive layer 60 and the gate electrode G1 of the transistor 121 included in the supply circuit 40b.

Furthermore, at the two supply circuits 40a and 40b disposed so as to adjacent to each other in the first direction, the transistors 121 to 124 of these circuits are disposed so as to be symmetric in plan view with respect to the imaginary line P overlapping with the conductive layer 60 and extending in the second direction. In the present disclosure, the imaginary line P represents an imaginary straight line passing through the center of the conductive layer 60 and extending along the second direction in plan view. However, the imaginary line P may be a straight line passing through a position shifted from the center of the conductive layer 60.

Note that, of the four transistors 121 to 124 included in each of the supply circuits 40a and 40b, it is desirable that the transistors 121 be disposed so as to be symmetric with respect to the imaginary line P, and the transistors 122 to 124 may not be symmetric with each other.

Furthermore, in plan view, a portion of the impurity region 180 is provided so as to overlap with the conductive layer 60 and extend along the second direction.

As illustrated in FIGS. 3 to 5, the impurity region 180 includes a region SD1 that is to be one of the source/drain regions of the transistor 121 included in the supply circuits 40a to 40f, and is electrically coupled to the power-supply wiring line 116 through the contact hole Ha2. In other words, the impurity region 180 is electrically coupled to the conductive layer 60 through the power-supply wiring line 116, and the impurity region 180 is supplied with the potential Vel. In addition, although illustration is not given, the impurity region 180 is provided over the second direction of the display unit 13.

As illustrated in FIGS. 4 to 8, the scanning line 12, the control lines 143 and 144, the relay wiring line 64, and the power-supply wiring line 16 are formed at the first wiring layer M1 together with the power-supply wiring line 116. The scanning line 12 is provided along the second direction for each of the rows, and is electrically coupled, through a contact hole Ha3, to the gate electrode G2 of the transistor 122 included in each of the supply circuits 40a to 40f.

The control line 143 is provided along the second direction for each of the rows, and is electrically coupled, through a contact hole Ha4, to the gate electrode G3 of the transistor 123 included in each of the supply circuits 40a to 40f.

The control line 144 is provided along the second direction for each of the rows, and is electrically coupled, through a contact hole Ha5, to the gate electrode G4 of the transistor 124 included in each of the supply circuits 40a to 40f.

The relay wiring line 64 is provided for each of the supply circuits 40. The relay wiring line 64 is electrically coupled to the gate electrode G1 of the transistor 121 through a contact hole Ha7, and is electrically coupled to one of the source/drain regions of the transistor 122 through a contact hole Ha8.

The power-supply wiring line 16 is a conductive layer supplied with a constant potential, for example, the potential Vel. The power-supply wiring line 16 is provided along the second direction in each of the rows. A portion of the power-supply wiring line 16 extends in the first direction and is disposed, in plan view, between relay wiring lines 64 of supply circuits 40 adjacent to each other in the second direction. In other words, in plan view, the power-supply wiring line 16 is disposed between relay wiring lines 64 of the supply circuit 40a and the supply circuit 40c and between relay wiring lines 64 of the supply circuit 40a and the supply circuit 40e, and is also disposed between relay wiring lines 64 of the supply circuit 40b and the supply circuit 40d and between relay wiring lines 64 of the supply circuit 40b and the supply circuit 40f.

The power-supply wiring line 116 is provided along the second direction so as to extend across both the row including the supply circuit 40a and the row including the supply circuit 40b. In plan view, the power-supply wiring line 116 is electrically coupled, through the contact hole Ha2, to the region SD1 that is to be one of the source/drain regions of the transistor 121 included in each of the supply circuits 40a to 40f. In addition, in plan view, the power-supply wiring line 116 overlaps with the conductive layer 60. Furthermore, in plan view, the power-supply wiring line 116 overlaps with the impurity region 180.

In addition, in plan view, at least a portion of the power-supply wiring line 116 is provided between the gate electrode G1 of the transistor 121 included in each of the supply circuit 40a, 40c, and 40e provided along the second direction and the gate electrode G1 of the transistor 121 included in each of the supply circuit 40b, 40d, and 40f provided along the second direction. In other words, in plan view, at least a portion of the power-supply wiring line 116 is provided between the gate electrode G1 of the transistor 121 included in the supply circuit 40a and the gate electrode G1 of the transistor 121 included in the supply circuit 40b.

FIGS. 3 and 4 illustrate two supply circuits 40 disposed adjacent to each other in the first direction. Furthermore, the layouts of the other supply circuits 40 are also set such that two supply circuits 40 disposed adjacent to each other in the first direction are arranged in a similar manner. As for two supply circuits 40 disposed adjacent to each other in the second direction, the same repeated pattern may be employed, or they may be disposed so as to be symmetric with respect to a certain imaginary line. Note that the first direction and the second direction in the layout of the supply circuit 40 are not limited to the direction of the X-axis and the direction of the Y-axis illustrated in FIG. 1.

As illustrated in FIG. 5, the power-supply wiring line 116 is provided at the first wiring layer M1, and the conductive layer 60 is provided at a layer between the power-supply wiring line 116 and the impurity region 180. In other words, the power-supply wiring line 116 is provided at an opposite side from the impurity region 180 relative to the conductive layer 60. In addition, as described above, the impurity region 180 and the power-supply wiring line 116 are electrically coupled to each other through the contact hole Ha2. In other words, the impurity region 180 and the power-supply wiring line 116 are electrically coupled to each other through a plurality of contact holes Ha2 provided at certain intervals in the second direction. Thus, a contact hole Ha2 is disposed between conductive layers 60 of two supply circuits 40 adjacent to each other in the second direction.

As illustrated in FIG. 6, the relay wiring line 64 is electrically coupled, through the contact hole Ha1, to the gate electrode G1 of the transistor 121 included in each of the supply circuits 40. In addition, the power-supply wiring line 16 is disposed between relay wiring lines 64 of two supply circuits 40 adjacent to each other in the second direction. Note that three power-supply wiring lines 16 illustrated in FIG. 6 are the same wiring line as illustrated in FIG. 4.

As illustrated in FIGS. 7 and 8, the conductive layer 60 is provided at the same layer as the gate electrode G1 of the transistor 121 included in the supply circuit 40a and the gate electrode G1 of the transistor 121 included in the supply circuit 40b, and is also provided between these two gate electrodes G1 in plan view. However, the conductive layer 60 may be provided at a layer differing from the gate electrode G1. In this case, it is possible to overlap a portion of the conductive layer 60 with the gate electrode G1 in plan view. In other words, it is only necessary that, in plan view, at least a portion of the conductive layer 60 is provided between the gate electrode G1 of the transistor 121 included in the supply circuit 40a and the gate electrode G1 of the transistor 121 included in the supply circuit 40b.

Furthermore, although illustration is not given, the upper layer of the first wiring layer M1 includes a second wiring layer where various types of signal lines such as the data line 14 and the control lines are disposed, a layer where the pixel electrode 31 of the light-emitting element 3 is disposed, a layer where the light emission function layer 32 of the light-emitting element 3 is disposed, a layer where the counter electrode 33 of a light-emitting element is disposed, or the like. However, the configuration is not limited to the configuration described above, and the wiring layer may be added or deleted on an as-necessary basis.

As described above, the electro-optical device 1 is electrically coupled to the transistor 121 included in the supply circuit 40a and the transistor 121 included in the supply circuit 40b, and includes the conductive layer 60 supplied with the potential Vel. In other words, two supply circuits 40 provided along the first direction are electrically coupled to the same conductive layer, which makes it possible to reduce the number of wiring lines provided in the electro-optical device 1 and also reduce the overall size of the supply circuit 40. This makes it possible to achieve the electro-optical device 1 having higher definition.

In addition, as described above, in plan view, at least a portion of the conductive layer 60 is provided between the gate electrode G1 of the transistor 121 included in the supply circuit 40a and the gate electrode G1 of the transistor 121 included in the supply circuit 40b. This makes it possible to suppress the influence of interference occurring between two gate electrodes G1 provided along the first direction, which makes it possible to improve the display quality of the electro-optical device 1.

Furthermore, as described above, in plan view, the distance H1 between the conductive layer 60 and the gate electrode G1 of the transistor 121 included in the supply circuit 40a is equal to the distance H2 between the conductive layer 60 and the gate electrode G1 of the transistor 121 included in the supply circuit 40b. This makes it possible to reduce a variation in the degree of suppression of the parasitic capacitor occurring in each of the supply circuits 40 due to the conductive layer 60.

In addition, as described above, in plan view, the transistor 121 included in the supply circuit 40a and the transistor 121 included in the supply circuit 40b are disposed so as to be symmetric with respect to the imaginary line P overlapping with the conductive layer 60 in plan view and extending in the second direction. This makes it possible to achieve highly efficient layout.

Furthermore, as described above, the conductive layer 60 is provided at the same layer as the gate electrode G1 of the transistor 121 included in the supply circuit 40a and the gate electrode G1 of the transistor 121 included in the supply circuit 40b. This makes it possible to suppress the influence of interference occurring between two gate electrodes G1 provided along the first direction, which makes it possible to improve the display quality of the electro-optical device 1.

In addition, as described above, the electro-optical device 1 includes the impurity region 180 supplied with the same potential as that to the conductive layer 60, and in plan view, the impurity region 180 overlaps with the conductive layer 60. Thus, the conductive layer 60 and the impurity region 180 suppress the influence of interference occurring between two gate electrodes G1 provided along the first direction, which makes it possible to improve the display quality of the electro-optical device 1.

Furthermore, as described above, the electro-optical device 1 is supplied with the same potential as that to the conductive layer 60, and includes the power-supply wiring line 116 provided at the opposite side from the impurity region 180 relative to the conductive layer 60. In addition, in plan view, the power-supply wiring line 116 overlaps with the conductive layer 60. Thus, the conductive layer 60, the impurity region 180, and the power-supply wiring line 116 suppress the influence of interference occurring between two gate electrodes G1 provided along the first direction, which makes it possible to improve the display quality of the electro-optical device 1.

In addition, as described above, the power-supply wiring line 116 is electrically coupled to the conductive layer 60 through the contact hole Ha1, and is also electrically coupled to the impurity region 180 through the contact hole Ha2. Thus, the contact hole Ha1 and the contact hole Ha2 suppress the influence of interference occurring between two gate electrodes G1 provided along the first direction, which makes it possible to improve the display quality of the electro-optical device 1.

Furthermore, as described above, the impurity region 180 includes one of the source/drain regions of the transistor 121 included in the supply circuit 40a, and also includes one of the source/drain regions of the transistor 121 included in the supply circuit 40b. This eliminates the need of providing another region, which makes it possible to reduce the overall size of the supply circuit 40. This makes it possible to achieve the electro-optical device 1 having higher definition.

Note that, in the embodiment described above, when the transistor 121 included in the supply circuit 40a is a first drive transistor, the light-emitting element 3 corresponding to this transistor 121 corresponds a first light-emitting element, and the gate electrode G1 of this transistor 121 corresponds to a first gate electrode. In addition, in this case, the transistor 121 included in the supply circuit 40b provided in the first direction relative to the supply circuit 40a corresponds to a second drive transistor. The light-emitting element 3 corresponding to this transistor 121 corresponds to a second light-emitting element. Furthermore, the gate electrode G1 of this transistor 121 corresponds to a second gate electrode. In addition, the contact hole Ha1 corresponds to a first contact hole, and the contact hole Ha2 corresponds to a second contact hole.

1B. Second Embodiment

A second embodiment will be described. Note that, in the examples described below, constituent elements having functions similar to those in the first embodiment are denoted with the reference characters used in the description of the first embodiment, and detailed explanation thereof will not be repeated as appropriate.

Figure 9:
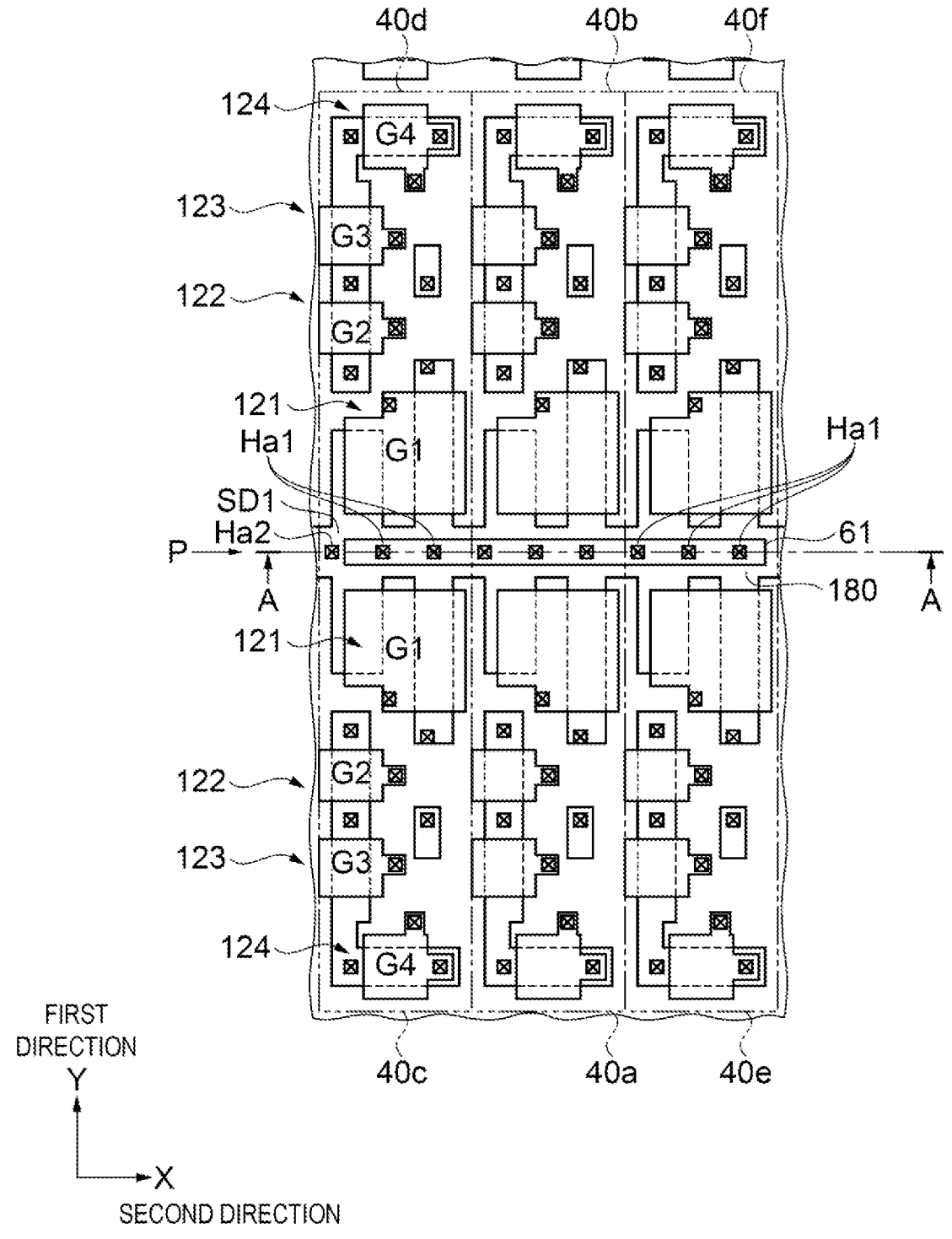
FIG. 9 is a plan view illustrating the layout of a gate electrode and an impurity region of a supply circuit according to a second embodiment.
Figure 10:
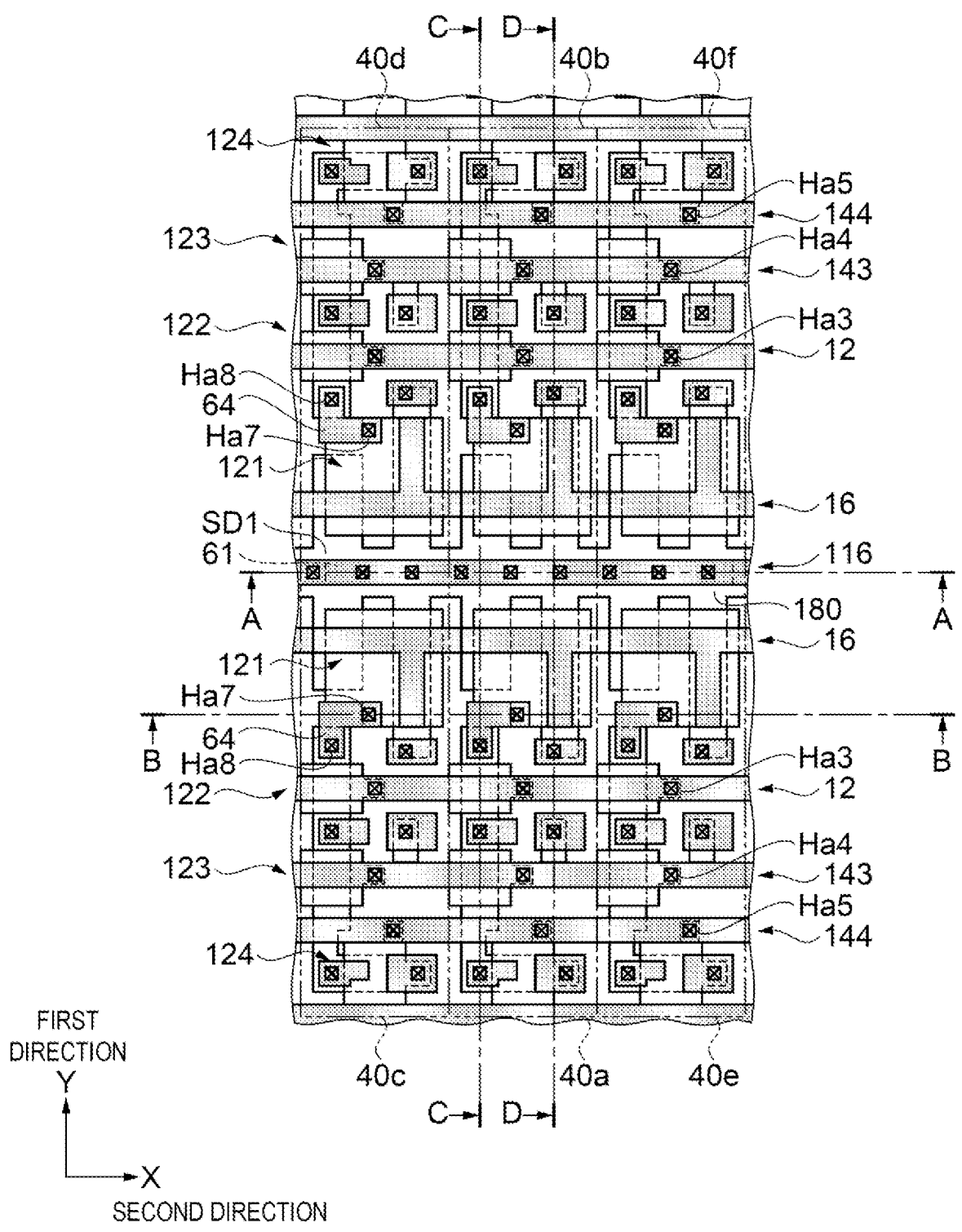
FIG. 10 is a plan view illustrating the layout of a first wiring layer of the supply circuit according to the second embodiment.
Figure 11:
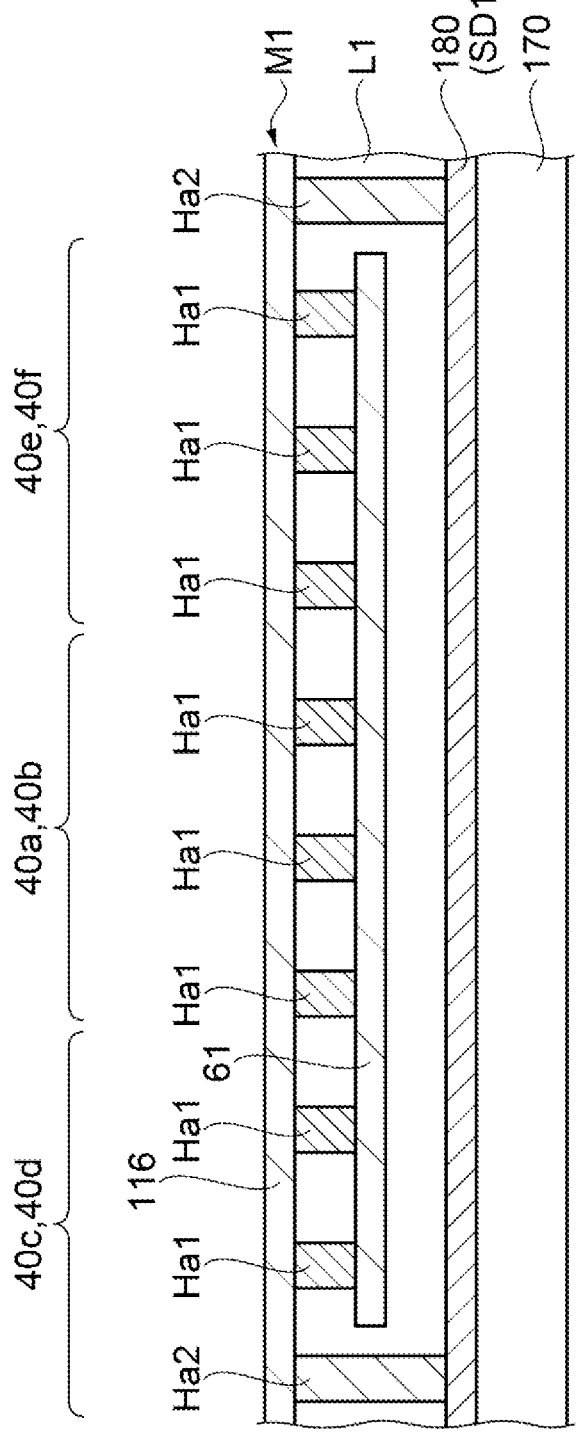
FIG. 11 is a cross-sectional view taken along the line A-A illustrated in FIG. 10.

FIG. 9 is a plan view illustrating the layout of the impurity region 180 and the gate electrodes G1 to G4 in the electro-optical device 1 according to a second embodiment, the gate electrodes G1 to G4 being at the supply circuits 40a to 40f including three circuits disposed adjacent to each other in the direction of the X-axis and two circuits disposed adjacent to each other in a direction of the Y-axis. In addition, FIG. 10 is a plan view illustrating the layout of the first wiring layer M1 at the supply circuits 40a to 40f illustrated in FIG. 9. In FIG. 10, the layout of the first wiring layer M1 is illustrated on the layout of the gate electrodes G1 to G4 and the impurity region 180. FIG. 11 is a cross-section view taken along the line A-A in FIG. 10. In the first embodiment, the conductive layer 60 is divided at each column where the supply circuit 40 is provided. However, in the present embodiment, in plan view, the width along the second direction includes a conductive layer 61 corresponding to three supply circuit 40a, 40c, and 40e.

As illustrated in FIGS. 9 to 11, in plan view, the conductive layer 61 is a conductive layer supplied with the potential Vel, and is electrically coupled to the transistor 121 included in the supply circuit 40a, the transistor 121 included in the supply circuit 40b, the transistor 121 included in the supply circuit 40c, the transistor 121 included in the supply circuit 40d, and the transistor 121 included in the supply circuit 40e, and the transistor 121 included in the supply circuit 40f.

Specifically, the width, along the second direction, of conductive layer 61 corresponds to the width, along the second direction, of three supply circuits 40a, 40c, and 40e disposed alongside each other in the second direction. In other words, in the present embodiment, the conductive layer 61 is divided at every three columns where the supply circuits 40 are provided.

In a case of the present embodiment, the width, along the second direction, of the conductive layer 61 is wider as compared with the conductive layer 60 according to the first embodiment. Thus, the number of contact holes Ha2 used to electrically couple the impurity region 180 and the power-supply wiring line 116 is small.

With the present embodiment, the width, along the second direction, of the conductive layer 61 is wide. This makes it possible to suppress the influence of interference occurring between two gate electrodes G1 provided along the first direction in plan view, and also suppress the influence of interference occurring between two gate electrodes G1 along the third direction (direction of the A axis illustrated in FIG. 1) and the fourth direction (direction of the B axis in FIG. 1) in plan view. For example, the conductive layer 61 makes it possible to suppress the influence of interference occurring between the gate electrode G1 of the transistor 121 included in the supply circuit 40a and the gate electrode G1 of the transistor 121 included in the supply circuit 40d. Furthermore, for example, the conductive layer 61 makes it possible to suppress the influence of interference occurring between the gate electrode G1 of the transistor 121 included in the supply circuit 40a and the gate electrode G1 of the transistor 121 included in the supply circuit 40f.

1C. Third Embodiment

A third embodiment will be described. Note that, in the examples described below, constituent elements having functions similar to those in the first embodiment are denoted with the reference characters used in the description of the first embodiment, and detailed explanation thereof will not be repeated as appropriate.

Figure 12:
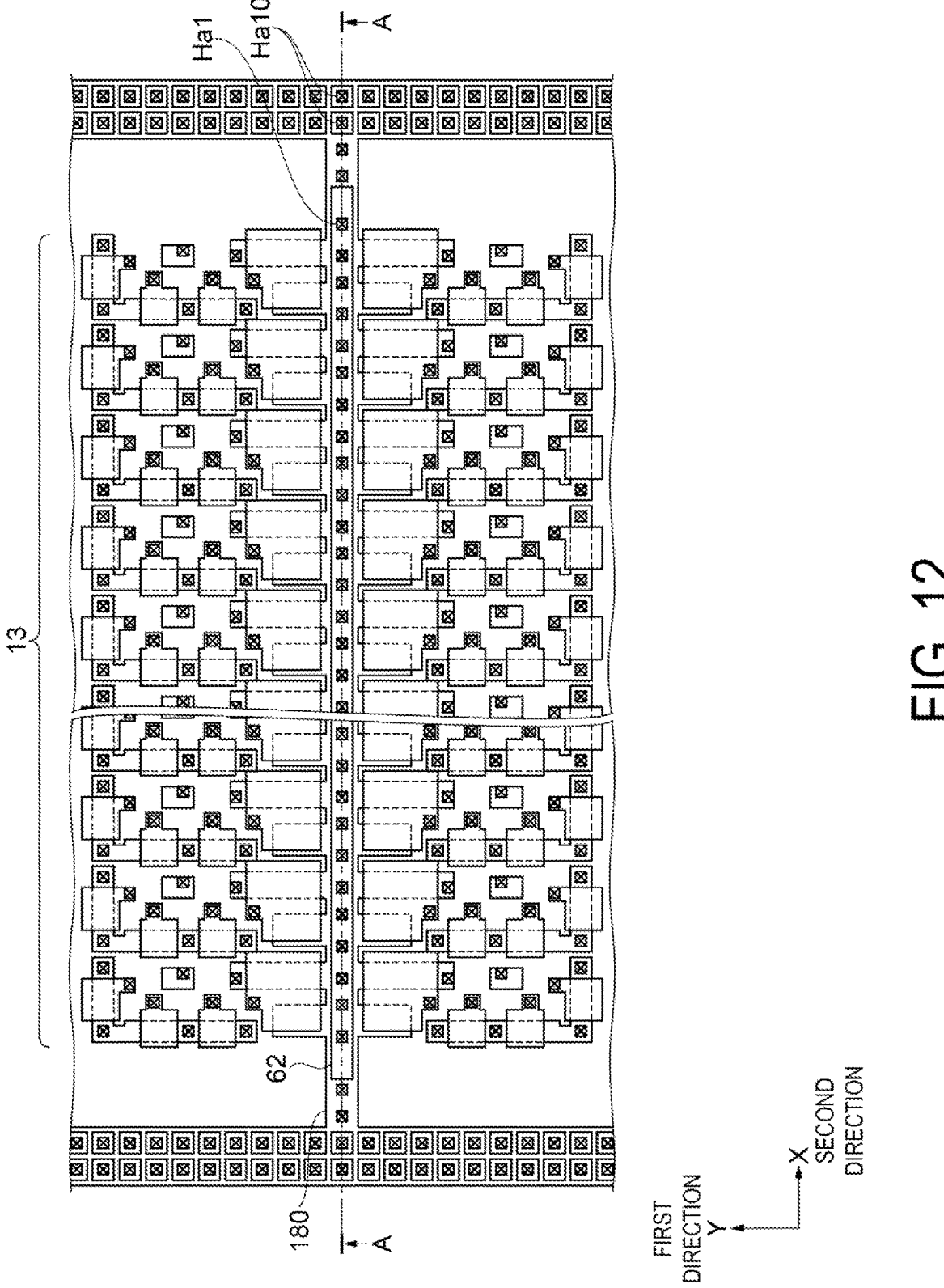
FIG. 12 is a plan view illustrating the layout of a gate electrode and an impurity region of a supply circuit according to a third embodiment.
Figure 13:
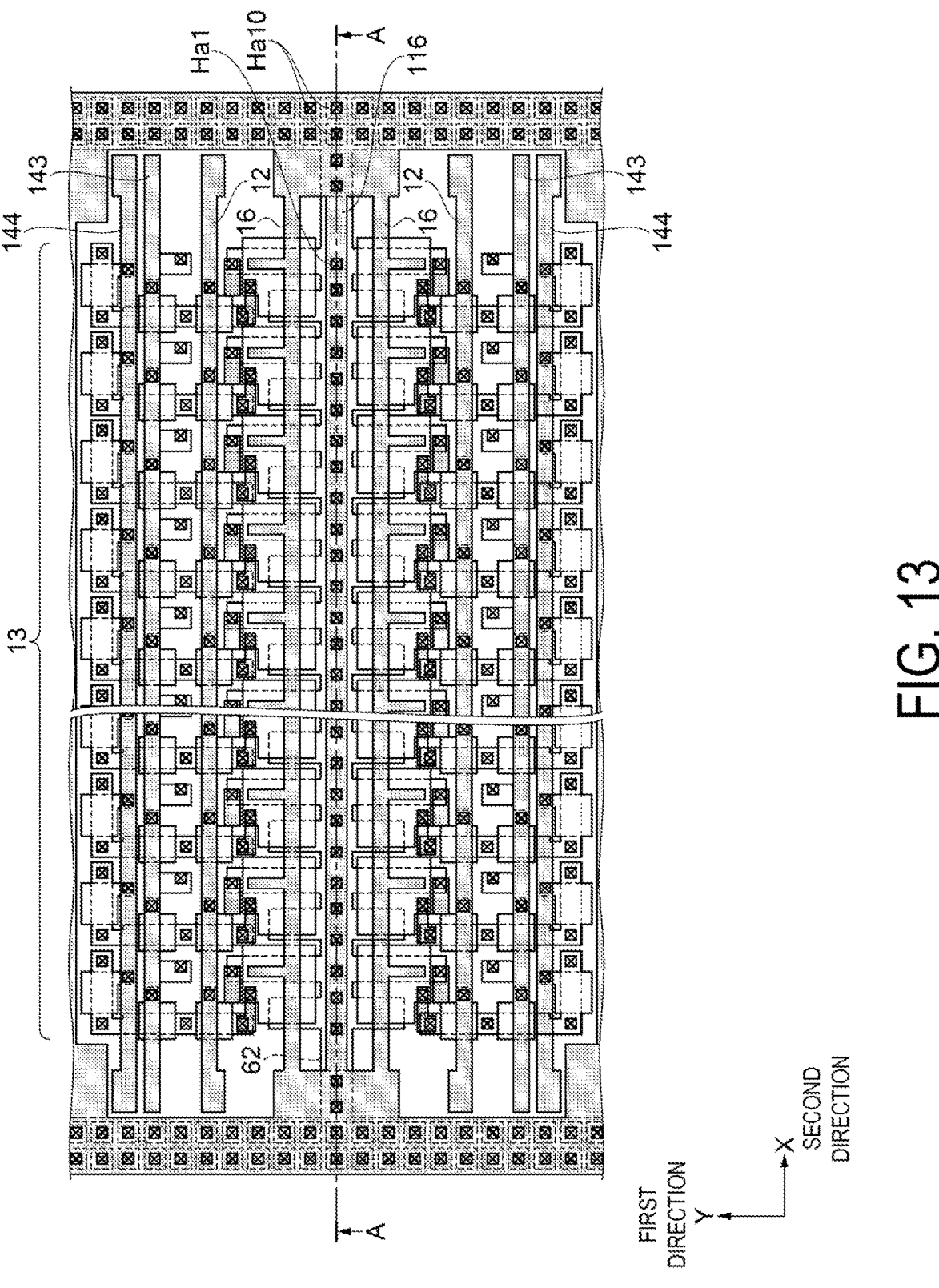
FIG. 13 is a plan view illustrating the layout of a first wiring layer of the supply circuit according to the third embodiment.
Figure 14:
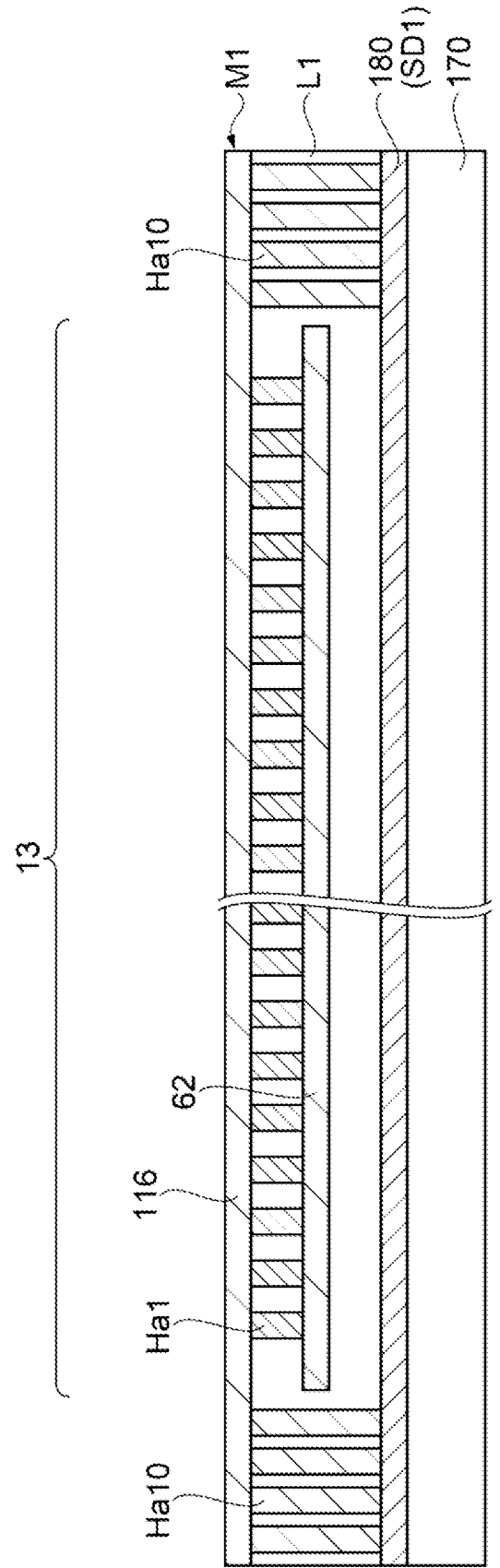
FIG. 14 is a cross-sectional view taken along the line A-A illustrated in FIG. 13.

FIG. 12 is a plan view illustrating the layout of the plurality of supply circuits 40, the impurity region 180, and the gate electrodes G1 to G4 in two supply circuits 40 in the electro-optical device 1 according to a third embodiment. The plurality of supply circuits 40 are disposed in the direction of the X-axis in the display unit 13, and the two supply circuits 40 are disposed adjacent to each other in the direction of the Y-axis. Furthermore, FIG. 13 is a plan view illustrating the layout of the first wiring layer M1 at the supply circuits 40 illustrated in FIG. 12. In the drawing, the layout of the first wiring layer M1 is illustrated on the layout of the gate electrodes G1 to G4 and the impurity region 180. In addition, FIG. 14 is a cross-sectional view taken along the line A-A in FIG. 13. In the first embodiment, the conductive layer 60 is divided at each column where the supply circuit 40 is provided. However, in the present embodiment, in plan view, the width along the second direction includes a conductive layer 62 corresponding to the width of the display unit 13.

As illustrated in FIGS. 12 to 14, the conductive layer 62 is a conductive layer supplied with the potential Vel. The conductive layer 62 is provided across the second direction of the display unit 13 in plan view, and is provided between gate electrodes G1 of transistors 121 included in two supply circuits 40 adjacent to each other in the first direction.

The conductive layer 62 is provided across the second direction of the display unit 13, and hence, the impurity region 180 and the power-supply wiring line 116 are not electrically coupled to each other within the display unit 13. The impurity region 180 and the power-supply wiring line 116 are electrically coupled to each other at the outside of the display unit 13 through a contact hole Ha10 or the like.

With the present embodiment, the width, along the second direction, of the conductive layer 62 is wide. This makes it possible to suppress the influence of interference occurring between two gate electrodes G1 provided along the first direction in plan view, and also suppress the influence of interference occurring between two gate electrodes G1 provided along the third direction (direction of the A axis illustrated in FIG. 1) and the fourth direction (direction of the B axis illustrated in FIG. 1) in plan view. In addition, the conductive layer 62 makes it possible to suppress the influence of interference occurring in the gate electrode G1 of the transistor 121 included in each of the plurality of supply circuits 40 provided at opposite sides from each other relative to the conductive layer 62.

Note that the "electro-optical device" is not limited to the organic EL device, and may be an inorganic EL device using an inorganic material or may be a μLED device.

2. Electronic Device

The electro-optical device 1 according to the embodiments described above can be applied to various types of electronic devices.

2-1. Head-Mounted Display

Figure 15:
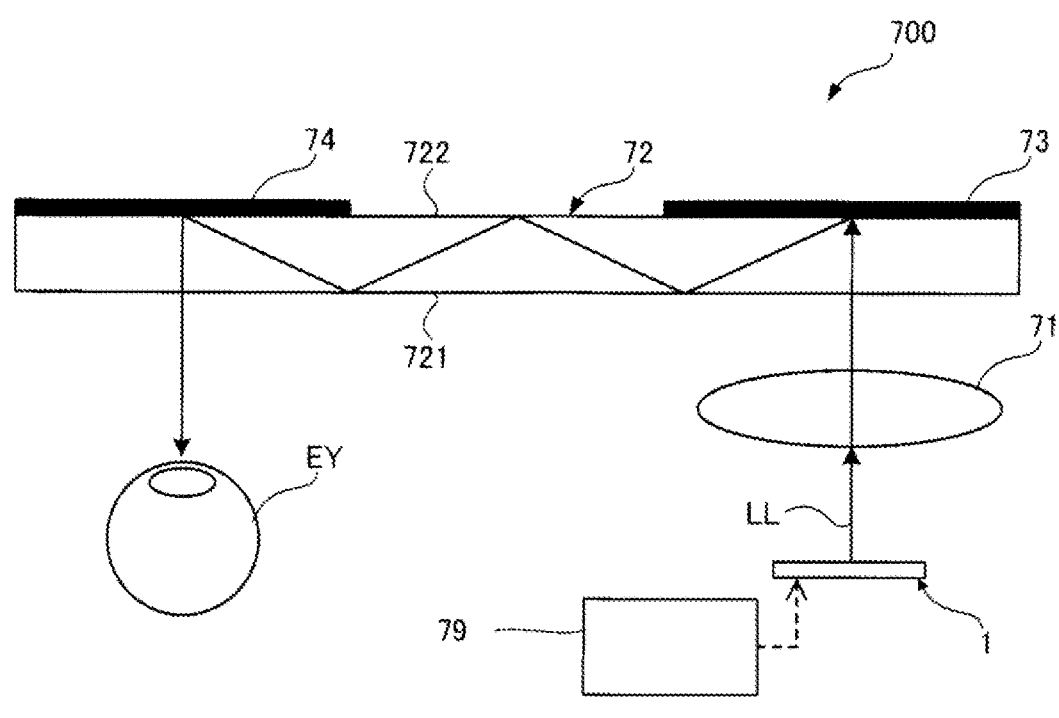
FIG. 15 is a plan view schematically illustrating a portion of a virtual image display device serving as one example of an electronic device.

FIG. 15 is a plan view schematically illustrating a portion of a virtual image display device 700 serving as one example of the electronic device. The virtual image display device 700 illustrated in FIG. 15 is a head-mounted display mounted at the head of an observer and configured to display an image. The virtual image display device 700 includes the electro-optical device 1 described above, a collimator 71, a light guide 72, a first reflective-type volume hologram 73, a second reflective-type volume hologram 74, and a control unit 79. Note that the light outputted from the electro-optical device 1 is outputted as image light LL.

The control unit 79 includes, for example, a processor and a memory, and controls operation of the electro-optical device 1. The collimator 71 is disposed between the electro-optical device 1 and the light guide 72. The collimator 71 collimates the light outputted from the electro-optical device 1. The collimator 71 includes a collimator lens or the like. The light converted into parallel light at the collimator 71 enters the light guide 72.

The light guide 72 has a flat plate shape, and is disposed so as to extend in a direction intersecting the direction in which the light enters through the collimator 71. The light guide 72 reflects, therewithin, the light and guides the light. A surface 721 of the light guide 72 that faces the collimator 71 includes a light incidence port where light enters, and a light exit port where light exits. A surface 722 of the light guide 72 that is disposed at the opposite side from the surface 721 includes the first reflective-type volume hologram 73 serving as a diffraction optical element and the second reflective-type volume hologram 74 serving as a diffraction optical element. The second reflective-type volume hologram 74 is provided at a position more toward the light exit port side than the first reflective-type volume hologram 73. The first reflective-type volume hologram 73 and the second reflective-type volume hologram 74 each include an interference fringe corresponding to a predetermined wavelength region, and diffract and reflect light in the predetermined wavelength region.

In the virtual image display device 700 having the configuration described above, an image light LL entering the light guide 72 from the light incidence port travels while repeating reflection and is guided from the light exit portion to the eyes EY of the observer. This enables the observer to observe an image comprised of a virtual image formed of the image light LL.

The virtual image display device 700 includes the electro-optical device 1 described above. The electro-optical device 1 described above has a small size and high definition. Thus, with the electro-optical device 1 being provided, it is possible to provide the small and light-weighted virtual image display device 700 having excellent display quality.

2-2. Personal Computer

Figure 16:
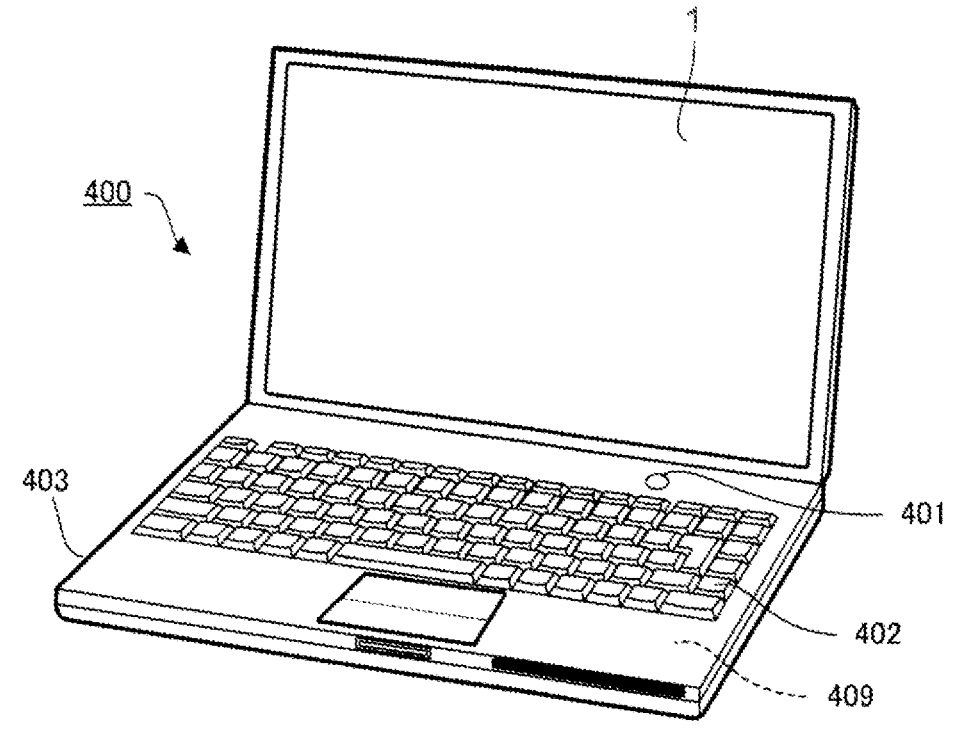
FIG. 16 is a perspective view illustrating a personal computer serving as one example of an electronic device.

FIG. 16 is a perspective view illustrating a personal computer 400 serving as one example of the electronic device according to the present disclosure. The personal computer 400 illustrated in FIG. 16 includes the electro-optical device 1, a main body portion 403 including a power supply switch 401 and a keyboard 402, and also includes a control unit 409. The control unit 409 includes, for example, a processor and a memory, and controls operation of the electro-optical device 1. The personal computer 400 includes the electro-optical device 1 described above. The electro-optical device 1 described above has a small size and high definition. Thus, with the electro-optical device 1 being provided, it is possible to provide the small and light-weighted personal computer 400 having excellent display quality.

Note that, the "electronic device" including the electro-optical device 1 includes a digital scope, digital binoculars, a digital still camera, a video camera, or other devices disposed so as to be close to eyes, in addition to the virtual image display device 700 illustrated, as an example, in FIG. 15 and the personal computer 400 illustrated, as an example, in FIG. 16. Furthermore, the "electronic device" including the electro-optical device 1 is used as a mobile phone, a smartphone, a personal digital assistant (PDA), a car navigation device, and a vehicle-mounted display unit. In addition, the "electronic device" including the electro-optical device 1 is used as illumination for emitting light.

These are descriptions of the present disclosure using the embodiments with reference to the drawings. However, the present disclosure is not limited these. In addition, the configuration of each component of the present disclosure may be replaced with any given configuration that exerts the equivalent functions of the above-described embodiments, and any given configuration may be added. Furthermore, in the present disclosure, any given configurations in each of the embodiments described above may be combined with each other.

What is claimed is:

1. An electro-optical device comprising:
a first light-emitting element;
a second light-emitting element;
a first drive transistor corresponding to the first light-emitting element;
a second drive transistor corresponding to the second light-emitting element and provided in a first direction relative to the first drive transistor;
a first conductive layer electrically coupled to the first drive transistor and the second drive transistor and supplied with a constant potential, the first conductive layer being provided along a second direction intersecting the first direction; and
a first power-supply wiring line and a second power-supply wiring line each being supplied with the constant potential, wherein
in a plan view, at least a portion of the first conductive layer is provided between a first gate electrode of the first drive transistor and a second gate electrode of the second drive transistor and is equal distance to the first gate electrode and the second gate electrode,
the first conductive layer is disposed between the first power-supply wiring line and the second power-supply wiring line in the first direction,
a portion of the first power-supply wiring line overlaps with the first gate electrode and extends toward a side of the first gate electrode in the first direction away from the first conductive layer, and
a portion of the second power-supply wiring line overlaps with the second gate electrode and extends toward a side of the second gate electrode in the first direction away from the first conductive layer.

2. The electro-optical device according to claim 1, wherein
the first conductive layer is provided at a same layer as the first gate electrode and the second gate electrode.

3. The electro-optical device according to claim 1, wherein
in the plan view, the first drive transistor and the second drive transistor are disposed so as to be symmetric with respect to an imaginary line overlapping with the first conductive layer and extending in the second direction.

4. The electro-optical device according to claim 3 comprising:
an impurity region provided along the second direction and supplied with a potential equal to that of the first conductive layer, wherein
in the plan view, the impurity region overlaps with the first conductive layer.

5. The electro-optical device according to claim 1 comprising:
an impurity region provided along the second direction and supplied with a potential equal to that of the first conductive layer, wherein
in a plan view, the impurity region overlaps with the first conductive layer.

6. The electro-optical device according to claim 5 comprising:
a second conductive layer supplied with a potential equal to that of the first conductive layer and provided at an opposite side of the first conductive layer from the impurity region, wherein

US 12,672,429 B2

15 in the plan view, the second conductive layer overlaps with the first conductive layer.

7. The electro-optical device according to claim 6, wherein the second conductive layer is electrically coupled to the first conductive layer through a first contact hole, and is electrically coupled to the impurity region through a second contact hole.

8. The electro-optical device according to claim 5, wherein the impurity region includes one of source/drain regions of the first drive transistor and one of source/drain regions of the second drive transistor.

9. An electronic device comprising the electro-optical device according to claim 1.

10. An electro-optical device comprising:

a first light-emitting element;

a second light-emitting element;

a first drive transistor corresponding to the first light-emitting element;

a second drive transistor corresponding to the second light-emitting element and provided in a first direction relative to the first drive transistor;

a first conductive layer electrically coupled to the first drive transistor and the second drive transistor and supplied with a constant potential, the first conductive layer being provided along a second direction intersecting the first direction; and a first power-supply wiring line and a second power-supply wiring line each being supplied with the constant potential, wherein in a plan view, the first drive transistor and the second drive transistor are disposed so as to be symmetric with respect to an imaginary line overlapping with the first conductive layer and extending in the second direction, the first conductive layer is disposed between the first power-supply wiring line and the second power-supply wiring line in the first direction, a portion of the first power-supply wiring line overlaps with a first gate electrode of the first drive transistor and extends toward a side of the first gate electrode in the first direction away from the first conductive layer, and a portion of the second power-supply wiring line overlaps with a second gate electrode of the second drive transistor and extends toward a side of the second gate electrode in the first direction away from the first conductive layer.

11. An electro-optical device comprising:

a first light-emitting element;

a second light-emitting element;

a first drive transistor corresponding to the first light-emitting element and including a first source, a first drain, and a first gate electrode;

a second drive transistor corresponding to the second light-emitting element and including a second source, a second drain, and a second gate electrode;

a first conductive layer being electrically coupled to the first drive transistor and the second drive transistor, being supplied with a constant potential, and being disposed between the first drive transistor and the second drive transistor in a plan view;

a second conductive layer being disposed along the first conductive layer in the plan view; and a third conductive layer being disposed along the first conductive layer in the plan view, wherein the first drive transistor and the second drive transistor are disposed along a first direction in the plan view,

the first conductive layer is disposed along a second direction intersecting the first direction in the plan view, the first gate electrode and the second gate electrode are disposed symmetrically with respect to an imaginary line overlapping with the first conductive layer, the imaginary line is extending along the second direction in the plan view, the second conductive layer and the third conductive layer are disposed symmetrically with respect to the imaginary line in the plan view, the second conductive layer overlaps with the first gate electrode between the first source and the first drain in the plan view, the third conductive layer overlaps with the second gate electrode between the second source and the second drain in the plan view, a portion of the second conductive layer overlapping the first gate electrode extends toward a side of the first gate electrode in the first direction away from the first conductive layer, and a portion of the third conductive layer overlapping the second gate electrode extends toward a side of the second gate electrode in the first direction away from the first conductive layer.

12. An electro-optical device comprising:

a first light-emitting element and a second light-emitting element that are disposed along a first direction in a plan view;

a third light-emitting element and a fourth light-emitting element that are disposed along the first direction in the plan view;

a first drive transistor corresponding to the first light-emitting element;

a second drive transistor corresponding to the second light-emitting element and being disposed in the first direction with respect to the first drive transistor in the plan view;

a third drive transistor corresponding to the third light-emitting element;

a fourth drive transistor corresponding to the fourth light-emitting element and being disposed in the first direction with respect to the third drive transistor in the plan view;

a first conductive layer extending along a second direction intersecting the first direction in the plan view, being supplied with a constant potential, and being disposed between the first drive transistor and the second drive transistor, and between the third drive transistor and the fourth drive transistor, in the plan view;

a second conductive layer being disposed along the first conductive layer in the plan view, and being electrically coupled to the first conductive layer;

a third conductive layer being disposed along the first conductive layer in the plan view, and being electrically coupled to the first conductive layer;

a fourth conductive layer being disposed between the first drive transistor and the second drive transistor, and overlapping with the first conductive layer in the plan view;

a fifth conductive layer being disposed between the third drive transistor and the fourth drive transistor, and overlapping with the first conductive layer in the plan view; and an insulating layer being disposed between the first conductive layer and the fourth conductive layer, and between the first conductive layer and the fifth conductive layer, the insulating layer having a first contact hole that electrically couples the first conductive layer and the fourth conductive layer, and having a second contact hole that electrically couples the first conductive layer and the fifth conductive layer, wherein the first conductive layer is electrically coupled to the first drive transistor, the second drive transistor, the third drive transistor, and the fourth drive transistor, the first drive transistor and the second drive transistor are disposed symmetrically with respect to an imaginary line overlapping with the first conductive layer, the imaginary line is extending along the second direction in the plan view, the third drive transistor and the fourth drive transistor are disposed symmetrically with respect to the imaginary line in the plan view, the second conductive layer and the third conductive layer are disposed symmetrically with respect to the imaginary line in the plan view, and the fourth conductive layer and the fifth conductive layer are apart from each other, and the first contact hole is disposed between the second conductive layer and the third conductive layer.

* * * * *